（12）United States Patent
Miller

(10) Patent No.: US 9,526,180 B2
(45) Date of Patent: Dec. 20, 2016

(54) REDUCING DIELECTRIC LOSS IN SOLDER MASKS

(75) Inventor: Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,667

(22) PCT Filed: Dec. 9, 2011

(86) PCT No.: PCT/US2011/064196
§ 371 (c)(1),
(2), (4) Date: Jun. 25, 2014

(87) PCT Pub. No.: WO2013/085542
PCT Pub. Date: Jun. 13, 2013

(65) Prior Publication Data
US 2014/0345923 A1 Nov. 27, 2014

(51) Int. Cl.
*H05K 1/00* (2006.01)
*H05K 3/00* (2006.01)
*H05K 3/28* (2006.01)
*B01F 3/12* (2006.01)

(52) U.S. Cl.
CPC ............. *H05K 3/0076* (2013.01); *B01F 3/12* (2013.01); *H05K 3/28* (2013.01); *H05K 3/285* (2013.01); *H05K 2201/0254* (2013.01)

(58) Field of Classification Search
CPC ........ H05K 3/0076; H05K 3/285; H05K 3/28; H05K 2201/0254; B01F 3/12
USPC ........................................................ 174/258
See application file for complete search history.

(56) References Cited

U.S. PATENT DOCUMENTS

| 6,078,013 A | 6/2000 | Stack |
| 6,861,092 B2 | 3/2005 | McCarthy et al. |
| 8,184,230 B2 * | 5/2012 | Schaeffer et al. ............... 349/58 |
| 2009/0325325 A1 * | 12/2009 | Patterson ................ H01L 22/14 438/15 |
| 2012/0279865 A1 * | 11/2012 | Regniere .................. C25D 5/48 205/125 |

FOREIGN PATENT DOCUMENTS

| JP | 2000-330274 A | 11/2000 |
| JP | 2002-226560 A | 8/2002 |
| JP | 2003-174244 A | 6/2003 |
| JP | 2010-031216 A | 2/2010 |
| WO | 2013/085542 A1 | 6/2013 |

OTHER PUBLICATIONS

International Preliminary Report on Patentability and Written Opinion received for PCT Patent Application No. PCT/US2011/064196, mailed on Jun. 19, 2014, 5 pages.
International Search Report and Written Opinion received for PCT application No. PCT/US2011/064196, mailed on Sep. 5, 2012, 8 pages.

* cited by examiner

*Primary Examiner* — Tremesha S Willis
(74) *Attorney, Agent, or Firm* — Jordan IP Law, LLC

(57) ABSTRACT

A circuit board may include a substrate, an interconnected structure associated with the substrate, and a solder mask associated with the interconnected structure and the substrate. The solder mask may be based on a mixture that includes epoxy and a powder. The powder may be hollow glass micro-balloons.

6 Claims, 4 Drawing Sheets

REDUCING DIELECTRIC LOSS IN SOLDER MASKS

BACKGROUND

Technical Field

Embodiments generally relate to printed circuit boards. More particularly, embodiments relate to solder masks used with printed circuit boards.

Discussion

A limiting factor in the ability to transmit high data rates through packages and through circuit boards may be the loss tangent of the materials involved. In particular, solder mask material typically has a high loss tangent.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may involve a printed circuit board which may include a substrate, an interconnected structure associated with the substrate, and a solder mask associated with the interconnected structure and the substrate. The solder mask may be based on a mixture that includes epoxy and a powder.

Embodiments may involve an apparatus which may include a mixer configured to generate a mixture to be used as a solder mask for a printed circuit board. The mixture may include epoxy and a low loss tangent material such as, for example, hollow glass micro-balloons.

Embodiments may involve a computer implemented method which may include creating a mixture that includes a mixture of epoxy and a powder. The method may further include applying the mixture to a primed circuit board as a solder mask. The powder may be hollow glass micro-balloons. The printed circuit board with the solder mask that includes the mixture of epoxy and hollow glass micro-balloons may then be cured.

Figure 1A:
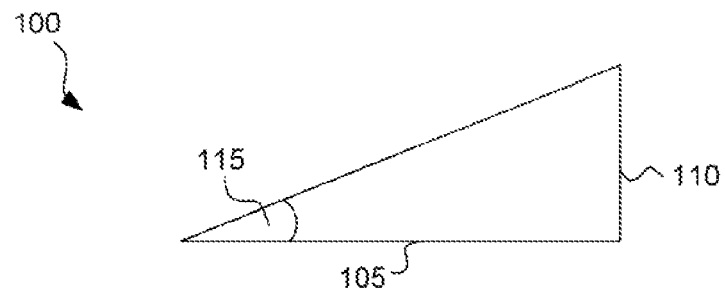
FIG. 1A is a block diagram that illustrates an example of the loss tangent concept, in accordance with some embodiments.

The concept of loss tangent may derive from the dielectric constant. The dielectric constant may relate to the speed of light in a material. By measuring the speed of light in a material, the dielectric constant may be determined. The dielectric constant may be a complex number and may consist of a real part and an imaginary part. The real part may relate to how fast electro-magnetic waves can travel in the material. The imaginary part may relate to how fast energy is lost in traveling through the material. The concept may be illustrated graphically using a right triangle 100 shown in FIG. 1A. The dielectric constant may be graphed as the right triangle 100 with its base 105 representing the real part, and its height 110 representing the imaginary part. The right triangle 100 may have an angle 115 at the vertex opposite the height 110. The tangent of the angle 115 may be referred to as the loss tangent.

Typical loss tangent in FR-4 material may be in the range of 0.02 plus or minus about 0.005. FR-4 is a grade designation assigned to glass-reinforced epoxy laminate sheets, tubes, rods and printed circuit boards. The loss tangent for solder mask may be higher than that of the FR-4. Generally, anything that is below about 0.01 may be considered as low loss.

Figure 1B:
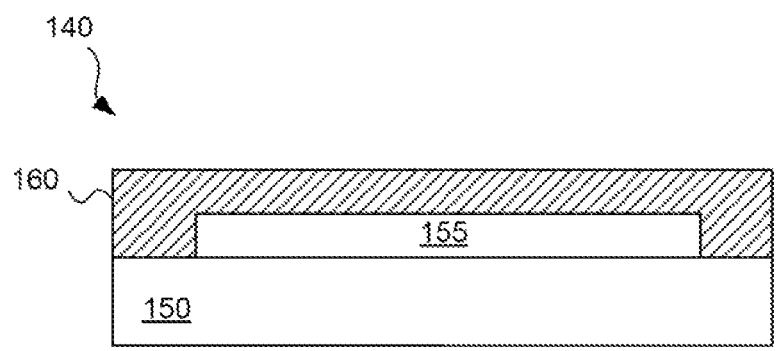
FIG. 1B is a block diagram that illustrates an example printed circuit board having a solder mask that may be based entirely on epoxy, in accordance with some embodiments.

Turning to FIG. 1B, an example portion of a single sided printed circuit board (PCB) 140 is shown. The printed circuit board 140 may include various interconnected circuits (may also be referred to as an interconnected structure) etched on top of a substrate 150 forming a metal layer 155. Electronic components may be placed on the surface of the substrate 150 and soldered to the interconnecting circuits. The printed circuit board 140 may include a solder mask 160. The solder mask 160 (or solder resist) may be a lacquer-like layer of epoxy that may provide a permanent protective coating for the metal layer 155. The solder mask 160 may prevent solder from bridging between conductors and therefore may help preventing short circuits. One problem with using the epoxy is the high loss tangent. Epoxy may account for a great majority of dielectric loss in circuit boards.

Figure 2:
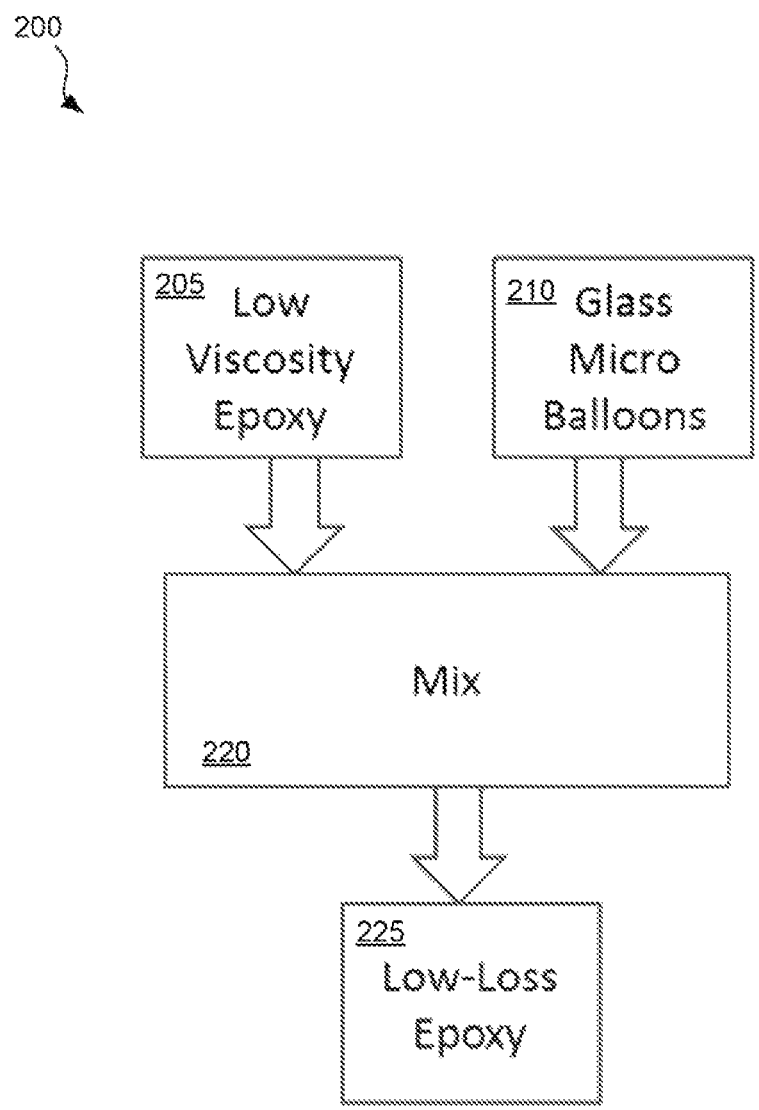
FIG. 2 is a block diagram that illustrates an example mechanism that may be used to create an epoxy mixture that may have low tangent loss characteristics, in accordance with some embodiments.

Turning to FIG. 2, a mechanism 200 for manufacturing a material that may be used for solder mask with low loss tangent is shown. The mechanism 200 may include a mixer 220 that is configured to accept an epoxy material from a first container 205 and a low loss tangent material from a second container 210. The low loss tangent material may be a powder such as a ceramic powder. For some embodiments, the low loss tangent material may be hollow glass micro-balloons. The viscosity of the epoxy may be low. For example, the viscosity of the epoxy may be adjusted so that the mixture may end up with about the same viscosity as an original solder-mask material used to make the solder mask 160.

The glass micro-balloons may be tiny (e.g., 50 microns) hollow glass micro balloons. The glass micro-balloons may be essentially a fine powder. The glass micro-balloons product may be a product from 3M Company of St. Paul, Minn. commonly used in conservation as a bulking agent or thickener in thixotropic mixtures such as resins and castings.

One advantage of using the glass micro-balloons is that they have very little loss tangent. Therefore, mixing the epoxy from the first container 205 with the hollow glass micro-balloons from the second container 210 may result in a mixture that has low loss tangent in the third container 225. Using the mixture in the third container 225 as a solder mask material may reduce the combined loss tangent by an amount that may be proportional to the volume ratios. For example, using a mixture that has 70% epoxy and 30% hollow glass micro-balloons as a solder mask material may reduce the loss tangent by approximately 30% comparing to using a material that is entirely epoxy.

Figure 3:
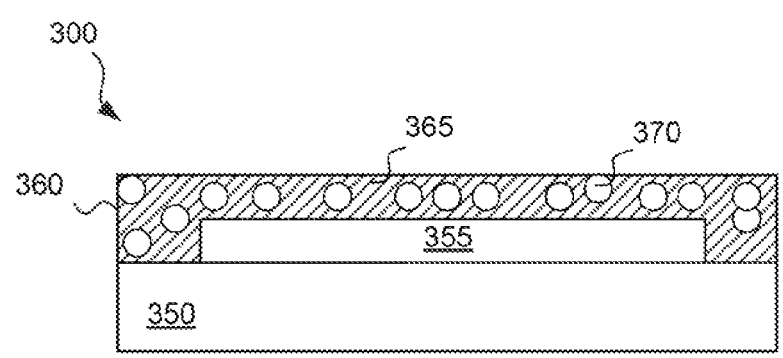
FIG. 3 is a block diagram that illustrates an example printed circuit board having a solder mask that may be based on an epoxy mixture that may have low tangent loss characteristics, in accordance with some embodiments.

Turning to FIG. 3, an example portion of a single sided printed circuit board 300 with a solder mask having low tangent loss is shown. The printed circuit board 300 may be similar to the printed circuit board 140 of FIG. 1B except that it may have a solder mask 360 that is based on an epoxy mix material that includes epoxy 365 and hollow glass micro-balloons 370 on top of the substrate 350 and the metal layer 355.

Figure 4:
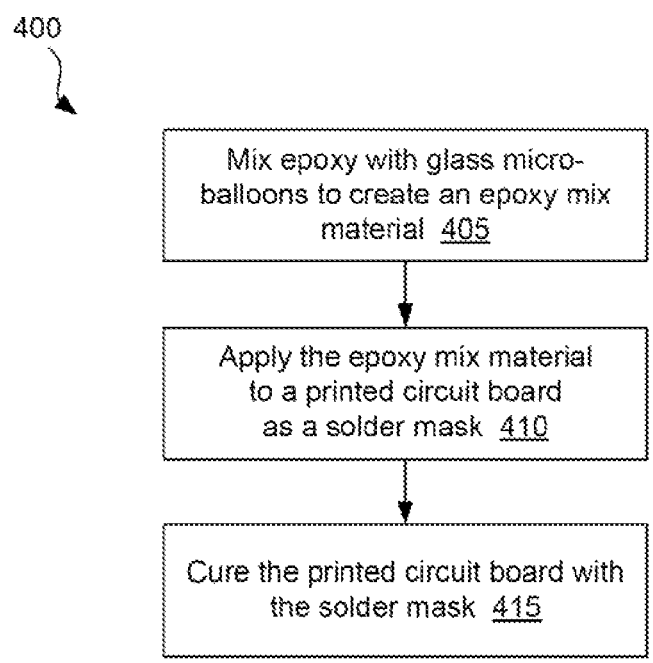
FIG. 4 is a flow diagram that illustrates an example method that may use an epoxy mix material having low tangent loss as a solder mask for a printed circuit board, in accordance with some embodiments.

Turning to FIG. 4, a flow diagram 400 that may correspond to a method for using a mixture as a solder mask to reduce the loss tangent is shown. The method may start at block 405 where a mixture of epoxy and glass micro-balloons may be created. At block 410, the mixture may be applied over a printed circuit board as a solder mask. At block 415, the printed circuit board with the mixture as the solder mask may be cured. The curing process may include, for example, heating the printed circuit board so that the solder mask may more securely protect the metal layer of the printed circuit board. The result from the block 415 may be a printed circuit board that may have lower loss tangents and that may enable faster data rates over longer distances across the printed circuit board.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shows within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc, might be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

I claim:

1. A circuit board comprising:
   a substrate;
   an interconnected structure associated with the substrate; and
   a solder mask associated with the interconnected structure and the substrate, wherein the solder mask is based on a mixture of epoxy and a relatively low loss tangent material, wherein the relatively low loss tangent material comprises hollow glass micro-balloons and wherein a percentage of the hollow glass micro-balloons of the mixture is proportional to a reduction of loss tangent of the mixture.

2. The circuit board of claim 1, wherein the epoxy has low viscosity.

3. An apparatus comprising:
   a mixer configured to generate a material to be used as a solder mask for a circuit board, wherein the material includes a mixture of epoxy and a relatively low loss tangent material, wherein the relatively low loss tangent material comprises hollow glass micro-balloons and wherein a percentage of the hollow glass micro-balloons of the mixture is proportional to a reduction of loss tangent of the mixture.

4. The apparatus of claim 3, wherein the epoxy has low viscosity.

5. A method comprising:
   creating a mixture that includes epoxy and a relatively low loss tangent material, wherein the relatively low loss tangent material comprises hollow glass micro-balloons and wherein a percentage of the hollow glass micro-balloons of the mixture is proportional to a reduction of loss tangent of the mixture;
   applying the mixture to a circuit board as a solder mask; and
   curing the circuit board with the solder mask.

6. The method of claim 5, wherein the epoxy has low viscosity.

* * * * *